(12) United States Patent
Hopper

(10) Patent No.: US 6,362,080 B1
(45) Date of Patent: Mar. 26, 2002

(54) FORMATION OF A VERTICAL JUNCTION THROUGH PROCESS SIMULATION BASED OPTIMIZATION OF IMPLANT DOSES AND ENERGIES

(75) Inventor: Peter J. Hopper, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/614,338

(22) Filed: Jul. 11, 2000

(51) Int. Cl.$^7$ .............................. H01L 21/425
(52) U.S. Cl. ...................... 438/514; 438/228
(58) Field of Search ................. 438/228, 287, 438/289, 514

(56) References Cited

U.S. PATENT DOCUMENTS

| | | | |
|---|---|---|---|
| 4,697,332 A | * | 10/1987 | Joy et al. .................... 437/29 |
| 5,753,956 A | * | 5/1998 | Honeycutt et al. ........... 257/372 |
| 6,066,523 A | * | 5/2000 | Shim et al. .................. 438/228 |
| 6,242,294 B1 | * | 6/2001 | Mitani et al. ................ 438/228 |

* cited by examiner

Primary Examiner—Richard Elms
Assistant Examiner—Brad Smith
(74) Attorney, Agent, or Firm—Beyer Weaver & Thomas, LLP

(57) ABSTRACT

A substantially vertical isolation junction between semiconductor devices is provided. The substantially vertical junction between a P-doped region and an N-doped region allows the P-doped region to be adjacent to the N-doped region with a lateral stagger with a width that is less than 0.1 of the depth. The substantially vertical junction is created by placing a first mask over part of a substrate. A first series of implants of a first dopant is implanted in the substrate. The first mask is removed and a second mask is placed over part of the substrate. A second series of implants of a second dopant of a second conductivity is then implanted in the substrate. A substantially vertical junction results.

14 Claims, 5 Drawing Sheets ved by the first mask. A second
FORMATION OF A VERTICAL JUNCTION THROUGH PROCESS SIMULATION BASED OPTIMIZATION OF IMPLANT DOSES AND ENERGIES

FIELD OF THE INVENTION

The present invention relates generally to semiconductor devices. More specifically, the invention relates to ion implantation used in making semiconductor devices.

BACKGROUND OF THE INVENTION

In the formation of semiconductor devices in integrated circuit chips, an isolation edge region may be formed to separate an N-doped region from a P-doped region.

To facilitate discussion, FIG. 1 is a schematic view of an isolation junction between an N-doped region 104, such as an N-well, and a P-doped region 108, such as a P-well, in a substrate 112. The N-doped region 104 may be formed by an ion implantation of an N-type dopant. The P-doped region 108 may be formed by an ion implantation of a P-type dopant. A spacer 116 may be used to separate the N-doped region 104 from the P-doped region 108. Both the N-doped region 104 and the P-doped region 108 extend under the spacer 116 due to lateral straggle of the implanted dopant and due to the lateral diffusion during temperature cycling. Lateral straggle is caused by implantation of the dopant in the substrate. Both lateral implant straggle and lateral diffusion may cause the N-doped region 104 to have a bowed shape 120 that extends under the spacer 116. In the prior art, lateral straggle may be about 0.7 times the depth of the junction while diffusion will cause dopant to move laterally as much as it does vertically. So for a junction with a 0.5 micron depth, the lateral straggle may be 0.35 microns. Lateral diffusion causes even more lateral travel. Providing space to accommodate the bowed shape 120 of the N-doped region 104 and the lateral 2*d* dopant profile of the P-doped region 108, caused by both lateral straggle and lateral diffusion, may waste chip real estate.

If the space required by the NP isolation junction could be reduced, the resulting chip size may also be reduced. It is desirable to provide a more compact NP junction to reduce the size of a semiconductor device.

SUMMARY OF THE INVENTION

To achieve the foregoing and other objects and in accordance with the purpose of the present invention, a variety of techniques is provided for forming an isolation junction between a region of a first conductivity type and a region of a second conductivity type in a substrate. Generally, a first series of dopings of a first conductivity type is provided. The first mask is then removed. A second mask is formed over a part of the surface of the substrate, wherein part of the surface covered by the first mask is not covered by the second mask and wherein part of the surface covered by the second mask was not covered by the first mask. A second series of dopings of a second conductivity type is provided, wherein the first series of dopings and the second series of dopings form a substantially vertical junction.

The present invention also provides a variety of techniques for determining a recipe for creating a vertical junction. Generally a first mask is specified. A first series of dopings is also specified. The removal of the first mask is then specified. A second mask is then specified. A second series of dopings of a second conductivity type is then specified. The resulting junction position is then determined. The first series of dopings and second series of dopings are then respecified to reduce a difference between the resulting junction position and a line through the junction.

The present invention also provides a region in a semiconductor substrate. The region has a P-doped region and an N-doped region in the substrate, where the N-doped region is adjacent to the P-doped region. A substantially vertical junction separates the P-doped region from the N-doped region.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
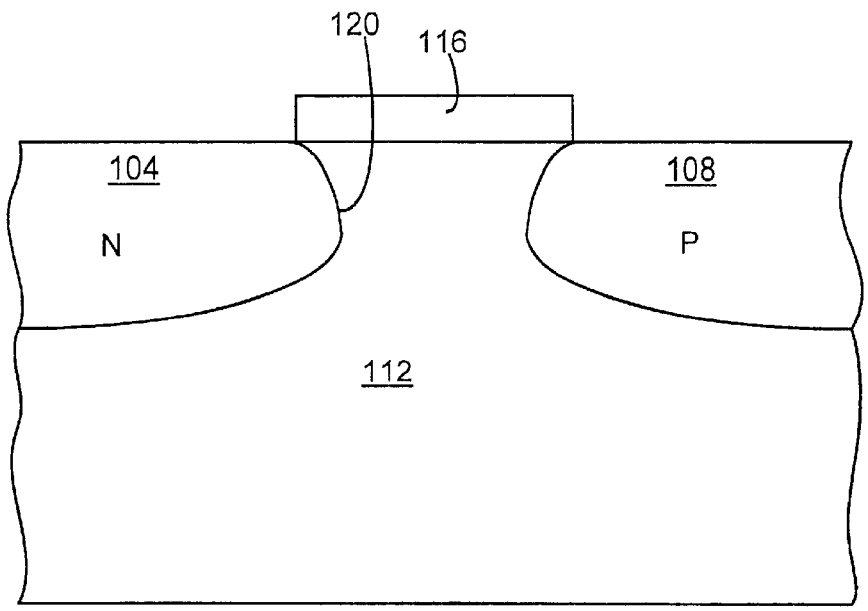
FIG. 1 is a schematic view of an isolation region used in the prior art.
Figure 3:
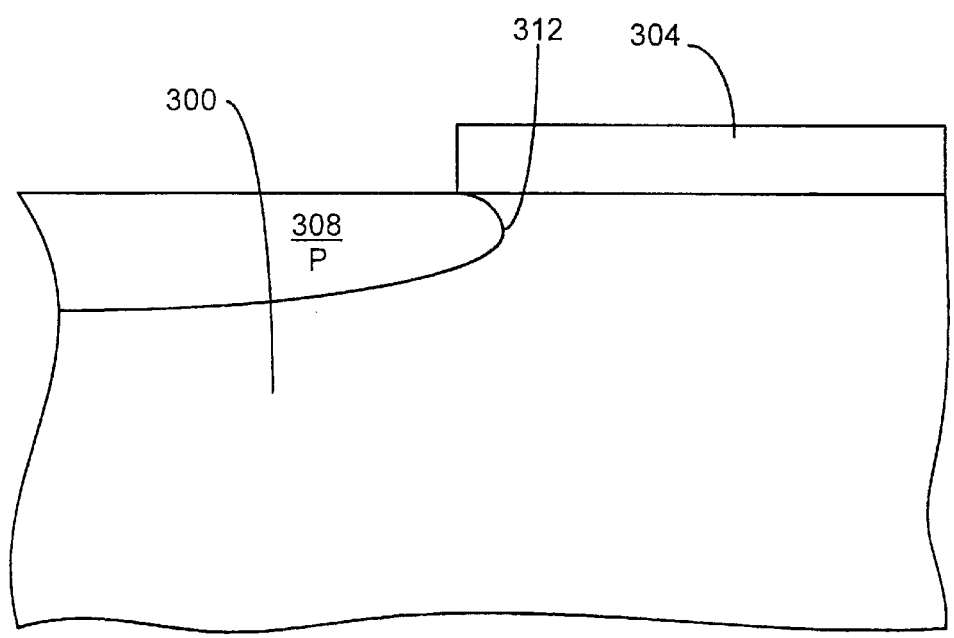
FIG. 3 is a schematic cross-sectional view of part of a substrate in the preferred embodiment of the invention.
Figure 2:
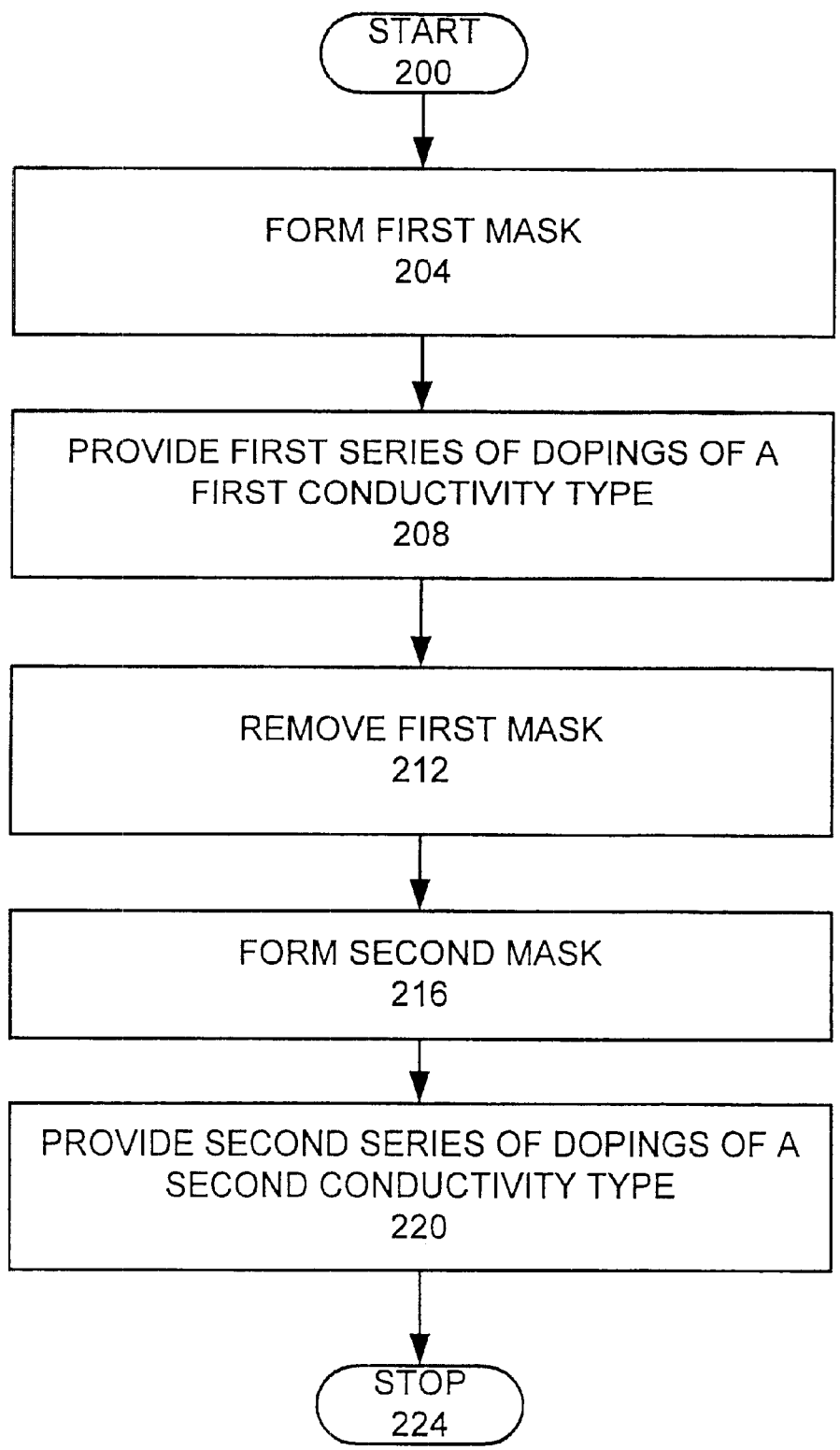
FIG. 2 is a flow chart of a process used in a preferred embodiment of the invention.

To facilitate discussion, FIG. 2 is a flow chart of a method used in a preferred embodiment of the invention. FIG. 3 is a schematic view of a substrate 300. The substrate is preferably a semiconductor substrate such as a silicon wafer. Alternatively, the substrate may be formed from a layer build on a silicon wafer. A first mask 304 is place over part of the substrate 300 surface (step 204). The first mask 304 may be a conventional mask made of a material such as photoresist hardmask, silicon dioxide, silicon nitride, silicon oxynitride, or polysilicon.

Figure 4:
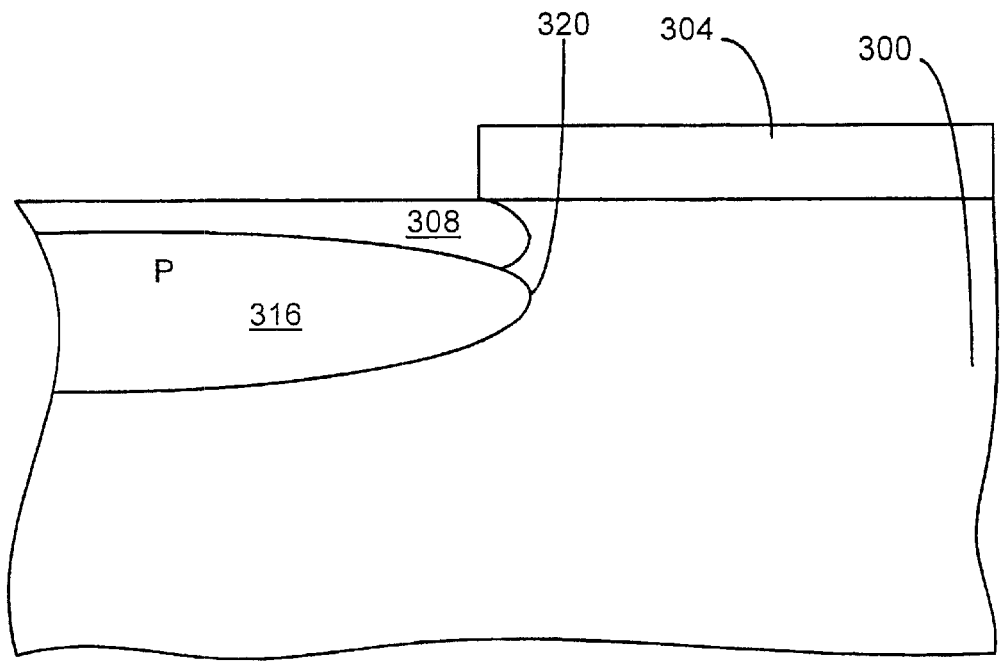
FIG. 4 is the schematic cross-sectional view of the substrate in FIG. 3 after a second doping.
Figure 5:
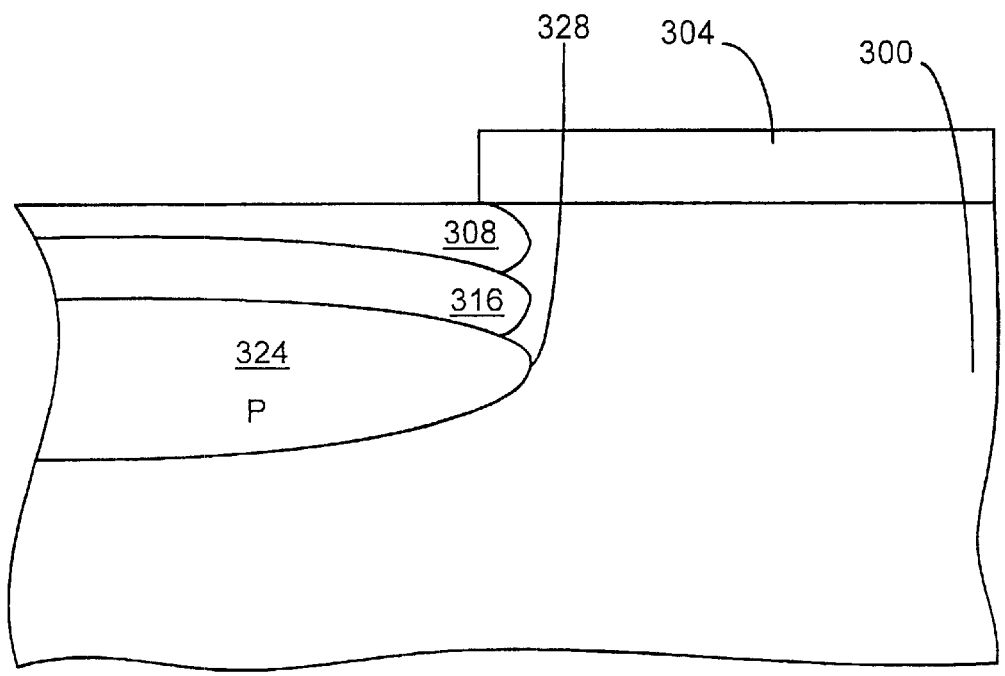
FIG. 5 is a schematic cross-sectional view of the substrate in FIG. 4 after a third doping.
Figure 6A:
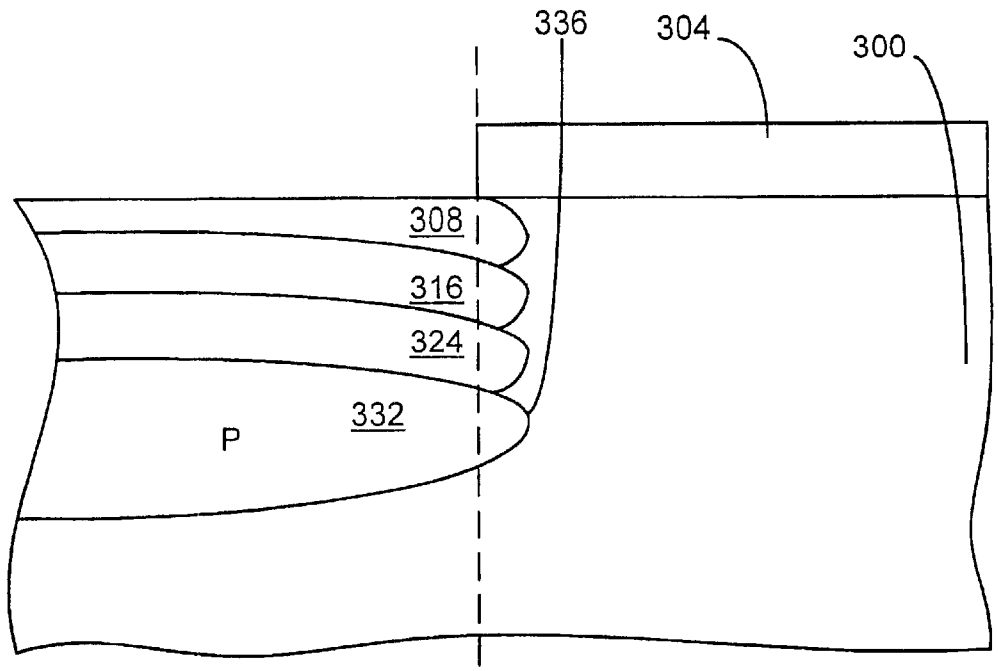
FIG. 6A is a schematic cross-sectional view of the substrate in FIG. 4 after a fourth doping.

A first series of implants implants a dopant of a first conductivity type (step 208). The first series of implants provides a series of implants at different depths. For example, a first implant of a P dopant at a first depth may provide a first P-doping profile 308. Part of the first P-doping profile 308 has a bow shaped region 312, which extends under the first mask 304. A second implant of a P dopant at a second depth may provide a second P-doping profile 316, as shown in FIG. 4. Part of the second P-doping profile 316 has a bow shaped region 320, which extends under the first mask 304, preferably about the same amount that the first P-doping profile 308 extends under the first mask 304. A third implant of a P dopant at a third depth may provide a third P-doping profile 324, as shown in FIG. 5. Part of the third P-doping profile 324 has a bow shaped region 328, which extends under the first mask 304, preferably about the same amount that the first P-doping profile 308 and the second P-doping profile 316 extend under the first mask 304. A fourth implant of a P dopant at a fourth depth may provide a fourth P-doping profile 332, as shown in FIG. 6A. Part of the fourth P-doping profile 332 has a bow shaped region 336, which extends under the first mask 304, preferably about the same amount that the first P-doping profile 308, the second P-doping profile 316, and the third P-doping profile 324 extend under the first mask 304.

Figure 6B:
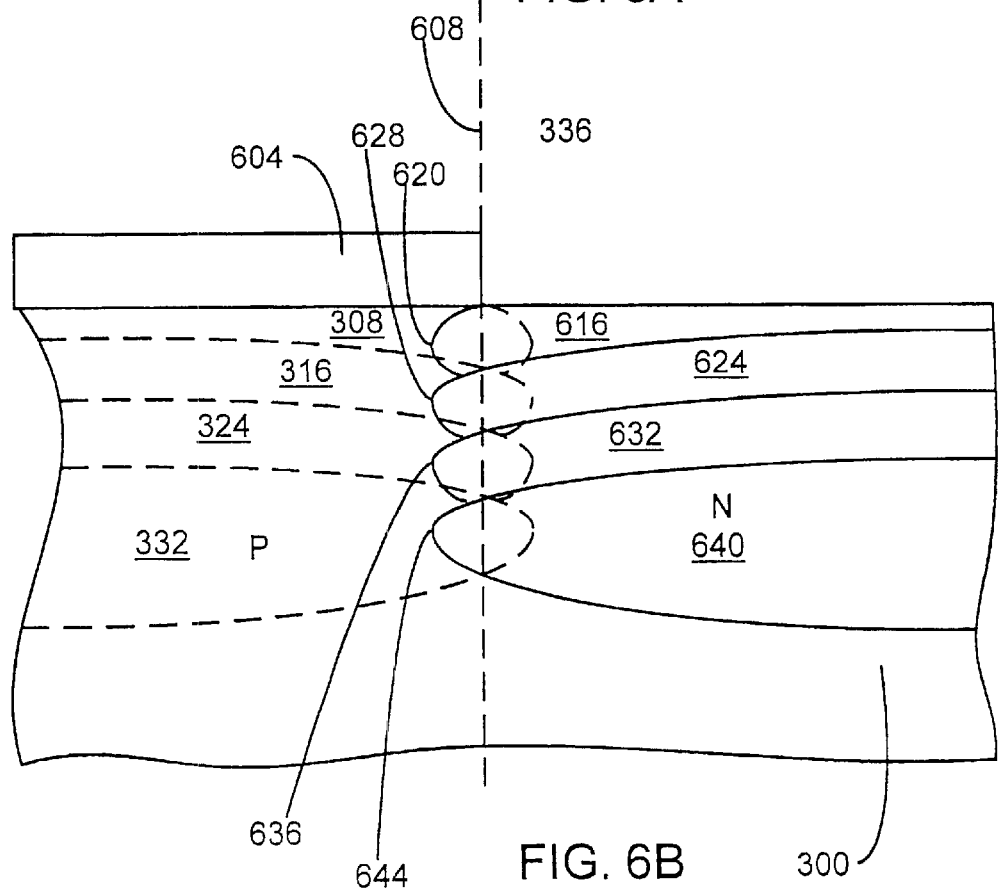
FIG. 6B is a schematic cross-sectional view of the substrate in FIG. 4 after a second series of dopings.

The first mask 304 is then stripped (step 212) and a second mask 604 is placed over part of the surface of the substrate 300 (step 216), as shown in FIG. 6B. Dashed line 608 between FIG. 6A and FIG. 6B indicates that the second hard mask 604 begins about where the first hard mask 304 ended, so that at least part of the second hard mask 604 covers an area not covered by the first hard mask 304. More preferably, the second hard mask 604 does not overlap with the first hard mask 304. The second mask 604 may be a conventional mask such as photoresist, hardmask, silicon dioxide, silicon nitride, silicon oxynitride, or polysilicon. The first, second, third, and fourth P-doping profiles 308, 316, 324, 332 from the first, second, third, and fourth implants of P dopant are shown in dashed lines.

In a similar manner to the first series of implants, a second series of implants implants a dopant of a second conductivity type, which in this example is an N dopant, at different depths (step 220). For example, a first implant of an N dopant at a first depth may provide a first N-doping profile 616. Part of the first N-doping profile 616 has a bow shaped region 620, which extends under the second mask 604. A second implant of an N dopant at a second depth may provide a second N-doping profile 624. Part of the second N-doping profile 624 has a bow shaped region 628, which extends under the second mask 604, preferably about the same amount that the first N-doping profile 616 extends under the second mask 604. A third implant of an N dopant at a third depth may provide a third N-doping profile 632. Part of the third N-doping profile 632 has a bow shaped region 636, which extends under the second mask 604, preferably about the same amount that the first N-doping profile 616 and the second N-doping profile 620 extend under the second mask 604. A fourth implant of an N dopant at a fourth depth may provide a fourth N-doping profile 640. Part of the fourth N-doping profile 640 has a bow shaped region 644, which extends under the second mask 604, preferably about the same amount that the first N-doping profile 616, the second N-doping profile 624, and the third N-doping profile 640 extend under the second mask 604.

Figure 7:
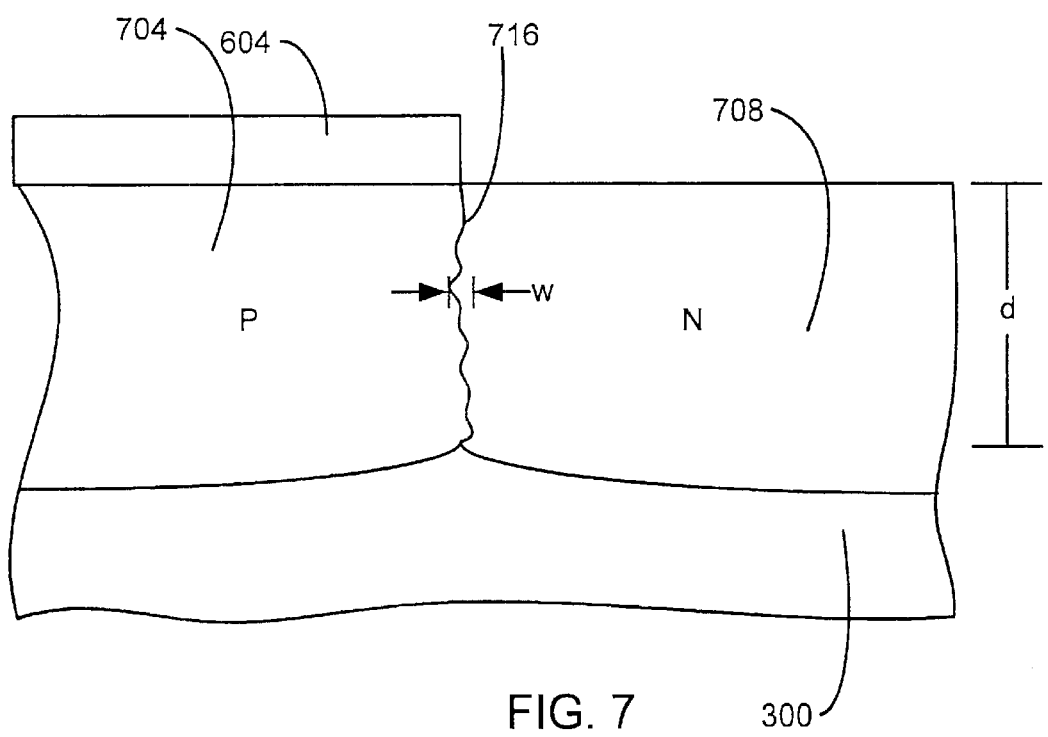
FIG. 7 is a schematic cross-sectional view of the resulting isolation junction.

With the correct amount of implant energies, dosage, and diffusion, the net doping profile provides a substantially vertical junction as shown in FIG. 7. In FIG. 7, the first, second, third, and fourth P-doping profiles 308, 316, 324, 332 form a P-region 704. The first, second, third, and fourth N-doping profiles 616, 624, 632, 640 form an N-region 708. Where the first, second, third, and fourth P-doping profiles 308, 316, 324, 332 overlap with the first, second, third, and fourth N-doping profiles 616, 624, 632, 640, the overlapping profiles may partially cancel each other, which results in a substantially vertical junction 712, which separates the P-region 704 from the N-region 708. Since the junction is substantially vertical, the real estate used by the junction is minimized. The second mask 604 may then be removed.

The junction has a depth indicated by "d". The lateral junction variance of the junction has a width "w", which is the variation of the junction from a vertical line. Generally, the deeper the vertical junction the wider the width. In the preferred embodiment of the invention, a substantially vertical junction is defined as a junction that has a width "w" and depth "d" where the ratio of the width to the depth (w/d) is less than 0.3. Such substantially vertical junctions may reduce the size of isolation junctions by more than half. More preferably, a substantially vertical junction is defined as a junction that has a width and depth, where the ratio of the width to the depth (w/d) is less than 0.1. Most preferably, a substantially vertical junction is defined as a junction that has a width and depth, where the ratio of the width to the depth (w/d) is less than 0.04. The most preferred embodiment may reduce the size of an isolation junction by more than ten times.

In each of the series of implants, an additional implant may allow the reduction of the extent of the bowing region. For example, for two implants in the first series of implants the bowing regions of each implant may not be as far as the bowing region if only one implant is used. By reducing the extent of the bowing region, in the preferred embodiment, a more vertical junction may be achieved. Preferably, at least four implants are used in each series of implants. More preferably, at least seven implants are used in each series of implants. Most preferably, at least ten implants are used in each series of implants.

Implant simulation programs that allow the modeling of implanting dopants in a substrate are known. Such implant simulation programs may use a look up table or a Monte Carlo method to provide such simulations. Diffusion simulation programs that allow the modeling of the diffusion of dopants in a substrate are known. Such diffusion simulation programs may use partial differential equations to provide such modeling. A process simulator that provides implant simulation and diffusion simulation may be used to simulate the first series of dopings and the second series of dopings and diffusion steps to see what parameters will provide a substantially vertical junction. Current process simulators may not be ideally calibrated to provide a vertical junction, but may be adapted to perform this function. Some of the variables that may be adjusted for each implant in the first and second series of implants to provide the vertical junction are dosage, energy, dopant, tilt, rotation and temperature. Some of the variables that may be adjusted for diffusion may be time, temperature, and ambient environment, such as ambient pressure. Oxidation and silidation may also be used to influence diffusion.

Parameters may also be found empirically. A series of wafers with different implant recipes may be created and measured. The recipes may then be adjusted so that a recipe for a vertical junction may be found.

In an iterative process that through simulation or empirically tests a recipe of a first series of dopings and a second series of dopings and then measures and changes the recipe and iteratively retests the changed recipe, the lateral junction variance may asymptotically approach zero.

The dopings in the first series of dopings may be provided by ion implants of different dopants. Similarly the dopings in the second series of dopings may be provided by ion implants of different dopants. In addition, the extent of the bowing region may be different for various implants in a series of dopings.

EXAMPLE

In an example of the inventive process, on a silicon wafer a layer of silicon oxide is formed to a 0.8 micron thickness. Parts of the silicon oxide layer are etched away to form a plurality of first masks. The first series of implants comprises 12 implants of phosphorous with the energies and dosage as shown in Table 1.

TABLE 1

| Energy (KeV) | Dosage (ions/cm$^2$) |
| --- | --- |
| 17.1578 | $1 \times 10^{12}$ |
| 46.6263 | $7.13627 \times 10^{12}$ |
| 81.4101 | $7.13627 \times 10^{12}$ |
| 99.1211 | $7.13652 \times 10^{12}$ |
| 124.224 | $7.1649 \times 10^{12}$ |
| 151.187 | $7.53313 \times 10^{12}$ |
| 231.242 | $2.47437 \times 10^{13}$ |
| 289.217 | $1.24162 \times 10^{13}$ |
| 212.451 | $1.61812 \times 10^{13}$ |
| 333.721 | $3.60466 \times 10^{11}$ |
| 386.602 | $9.54039 \times 10^{11}$ |
| 538.794 | $1.64323 \times 10^{11}$ |

The plurality of first masks is then etched away. A silicon oxide layer is formed to a 0.5 micron thickness. Parts of the silicon oxide layer are etched away to form a plurality of second masks. A second series of implants comprises nine implants of boron with the energies and dosage as shown in Table 2.

TABLE 2

| Energy (KeV) | Dosage (ions/cm$^2$) |
| --- | --- |
| 19.1722 | $8.19967 \times 10^{12}$ |
| 25.2325 | $8.18716 \times 10^{12}$ |
| 31.2937 | $8.14029 \times 10^{12}$ |
| 55.7132 | $6.64223 \times 10^{12}$ |
| 77.9547 | $2.33371 \times 10^{13}$ |
| 106.747 | $9.054 \times 10^{12}$ |
| 127.265 | $1.15272 \times 10^{13}$ |
| 144.531 | $1.26398 \times 10^{13}$ |
| 145.646 | $3.56678 \times 10^{12}$ |

The resulting junction may have a depth of about 0.3 microns. The lateral junction variance from a vertical line (w) may be less than 0.01 microns. Therefore, the width to depth ratio (w/d) is 1/30 or 0.0333.

An iterative process may be used to further reduce the width to depth ratio. Such an iterative process may provide a diffusion step. Such a diffusion step may specify a time, such as 10 seconds, and a temperature, such as 150° C.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for forming a junction between a region of a first conductivity type and a region of a second conductivity type in a substrate, comprising:

forming a first mask over a part of a surface of the substrate;

providing a first series of dopings of a first conductivity type;

removing the first mask;

forming a second mask over a part of the surface of the substrate, wherein part of the surface covered by the first mask is not covered by the second mask and wherein part of the surface covered by the second mask was not covered by the first mask; and providing a second series of doping of a second conductivity type, wherein the first series of dopings and the second series of dopings form a substantially vertical junction.

2. The method, as recited in claim 1, wherein the first series of dopings comprises at least four ion implants, and wherein the second series of dopings comprises at least four ion implants.

3. The method, as recited in claim 2, further comprising heating the substrate to cause diffusion of dopants from the first series of dopings and the second series of dopings.

4. The method, as recited in claim 3, wherein the vertical junction has a depth and a width, wherein the ratio of the width to the depth is less than 0.3.

5. The method, as recited in claim 3, wherein the vertical junction has a depth and a width, wherein the ratio of the width to the depth is less than 0.1.

6. The method, as recited in claim 3, wherein the vertical junction has a depth and a width, wherein the ratio of the width to the depth is less than 0.04.

7. The method, as recited in claim 1, wherein the first series of dopings comprises at least seven ion implants, and wherein the second series of dopings comprises at least seven ion implants.

8. The method, as recited in claim 7, wherein the vertical junction has a depth and a width, wherein the ratio of the width to the depth is less than 0.3.

9. The method, as recited in claim 8, wherein the vertical junction has a depth and a width, wherein the ratio of the width to the depth is less than 0.1.

10. The method, as recited in claim 9, wherein the vertical junction has a depth and a width, wherein the ratio of the width to the depth is less than 0.04.

11. The method, as recited in claim 1, wherein the vertical junction has a depth and a width, wherein the ratio of the width to the depth is less than 0.3.

12. The method, as recited in claim 1, wherein the vertical junction has a depth and a width, wherein the ratio of the width to the depth is less than 0.1.

13. The method, as recited in claim 1, wherein the vertical junction has a depth and a width, wherein the ratio of the width to the depth is less than 0.04.

14. A method for determining a recipe for creating a vertical junction, comprising:

specifying a recipe, comprising:

specifying a first mask;

specifying a first series of dopings of a first conductivity type;

specifying the removal of the first mask;

specifying a second mask;

specifying a second series of dopings of a second conductivity type;

measuring a resulting junction created from the recipe;

measuring a difference between the resulting junction and a vertical line;

modifying the recipe according to the difference between the resulting junction and a vertical line;

measuring the resulting junction created from the modified recipe;

measuring if a difference between the resulting junction and a vertical line is less than a threshold; and repeating the step of modifying the recipe until the difference between the resulting junction and a vertical line is less than the threshold.

* * * * *